(12) United States Patent
Lin Chen

(10) Patent No.: US 6,481,098 B1
(45) Date of Patent: Nov. 19, 2002

(54) METHOD OF MANUFACTURING CIRCUIT BOARDS

(76) Inventor: Shou-Chih Lin Chen, No. 22, Alley 402, Sec. 2, Nan Kaan Rd., Lu Chu Shiang, Tao Yuan Hsien (TW)

( * ) Notice: Subject to any disclaimer, the term of this patent is extended or adjusted under 35 U.S.C. 154(b) by 0 days.

(21) Appl. No.: 09/897,990

(22) Filed: Jul. 5, 2001

(51) Int. Cl.⁷ .................................................. H05K 3/30
(52) U.S. Cl. ........................... 29/829; 29/832; 29/840; 29/426.1; 29/402.11
(58) Field of Search ........................ 29/832, 829, 840, 29/426.1, 426.2, 426.3, 407.1, 593, 402.04, 402.05, 402.06, 402.08, 402.09, 402.11, 402.13, 402.16, 402.18

(56) References Cited

U.S. PATENT DOCUMENTS

| | | | | |
|---|---|---|---|---|
| 4,376,399 A | * | 3/1983 | Victor ......................... | 414/412 |
| 4,822,196 A | * | 4/1989 | Miller ......................... | 403/262 |
| 5,067,229 A | * | 11/1991 | Nakamura ................. | 174/52.2 |
| 5,259,107 A | * | 11/1993 | Tanabe et al. ............... | 225/105 |
| 6,256,882 B1 | * | 7/2001 | Gleason et al. ............ | 29/426.1 |
| 6,359,233 B1 | * | 3/2002 | Joy et al. ..................... | 174/250 |
| 6,370,766 B1 | * | 4/2002 | Degani et al. ................ | 29/832 |

* cited by examiner

Primary Examiner—Timothy V. Eley
Assistant Examiner—Alvin J. Grant
(74) Attorney, Agent, or Firm—Dennison, Schultz & Dougherty

(57) ABSTRACT

A method for manufacturing circuit boards at reduced cost includes the steps of producing a plurality of identical circuit board units on a big base plate at one time, so that each circuit board unit is connected to the base plate only at several connecting joints; conducting a circuit test for each circuit board unit; if any defective circuit board unit is found, using a cutting module to cut the connecting joints between the base plate and the defective circuit board unit and removing the latter to leave a void on the base plate; using a trimming module to trim off the broken connecting joints; using a shearing module to cut a substitute and good circuit board unit from a spare base plate; and moving the substitute circuit board unit into the void on the base plate, and fixing it in place in the void with adhesive.

1 Claim, 3 Drawing Sheets

METHOD OF MANUFACTURING CIRCUIT BOARDS

BACKGROUND OF THE INVENTION

The present invention relates to a method of manufacturing circuit boards, and more particularly to a method for manufacturing a plurality of identical circuit board units on a base plate at one time and replacing any defective circuit board unit with a good one without discarding the whole base plate.

Generally, a circuit board manufacturer produces circuits on base plates and supplies the base plates with circuits to electric appliance manufacturers. That is, the circuit board manufacturer's work does not include the connection of electronic components to the circuit boards.

To mass-produce circuit boards, the circuit board manufacturer usually produces a plurality of small circuit boards on one big base plate to increase productivity. It is almost inevitable to have one or more defective small circuit boards mass-produced on the same one base plate. This small part of defective circuit boards often causes rejection of the whole base plate by the electric appliance manufacturer, resulting in serious loss to the circuit board manufacturer.

For the circuit board manufacturer, there are still many normal and usable circuit boards on the rejected base plate, and it would be a waste to discard the whole base plate. Such waste would result in increased manufacturing cost and poor competing ability of the manufacturer in markets.

SUMMARY OF THE INVENTION

A primary object of the present invention is to provide a method of manufacturing circuit boards that allows repair of a base plate having one or more defective circuit board units among a plurality of identical circuit board units formed on the base plate, so as to reduce manufacturing cost of mass-produced circuit boards.

To achieve the above and other objects, the method of the present invention mainly includes the steps of producing a plurality of identical circuit board units on a big base plate at one time, so that each circuit board unit is connected to the base plate only at several connecting joints; conducting a circuit test for each circuit board unit; if any defective circuit board unit is found, using a cutting module to cut the connecting joints between the base plate and the defective circuit board unit and removing the latter to leave a void on the base plate; using a trimming module to trim off the broken connecting joints; using a shearing module to cut a substitute and good circuit board unit from a spare base plate; and moving the substitute circuit board unit into the void on the base plate, and fixing it in place in the void with adhesive.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
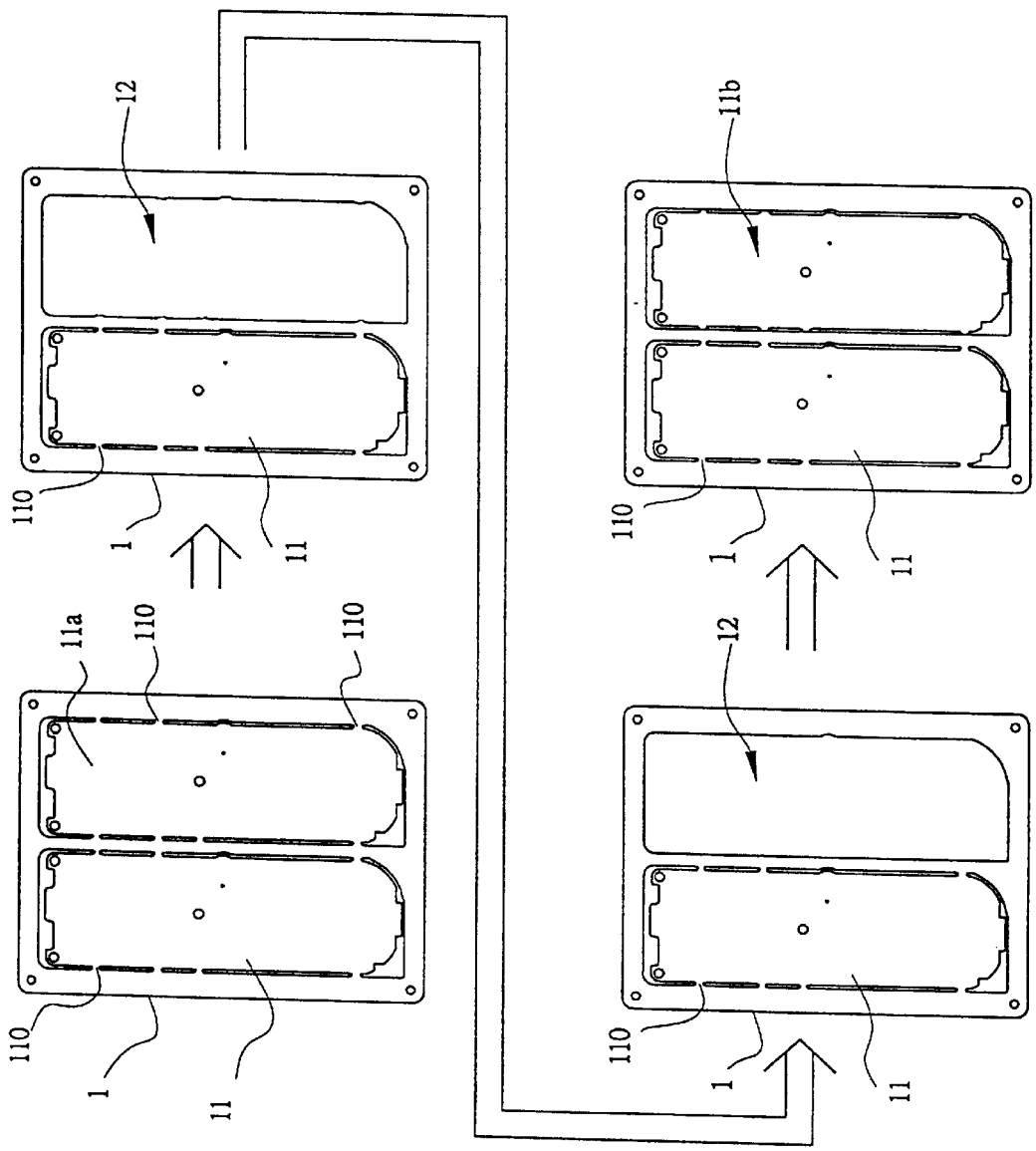
FIG. 1 shows steps of manufacturing a plurality of circuit board units on a base plate according to the method of the present invention.
Figure 2:
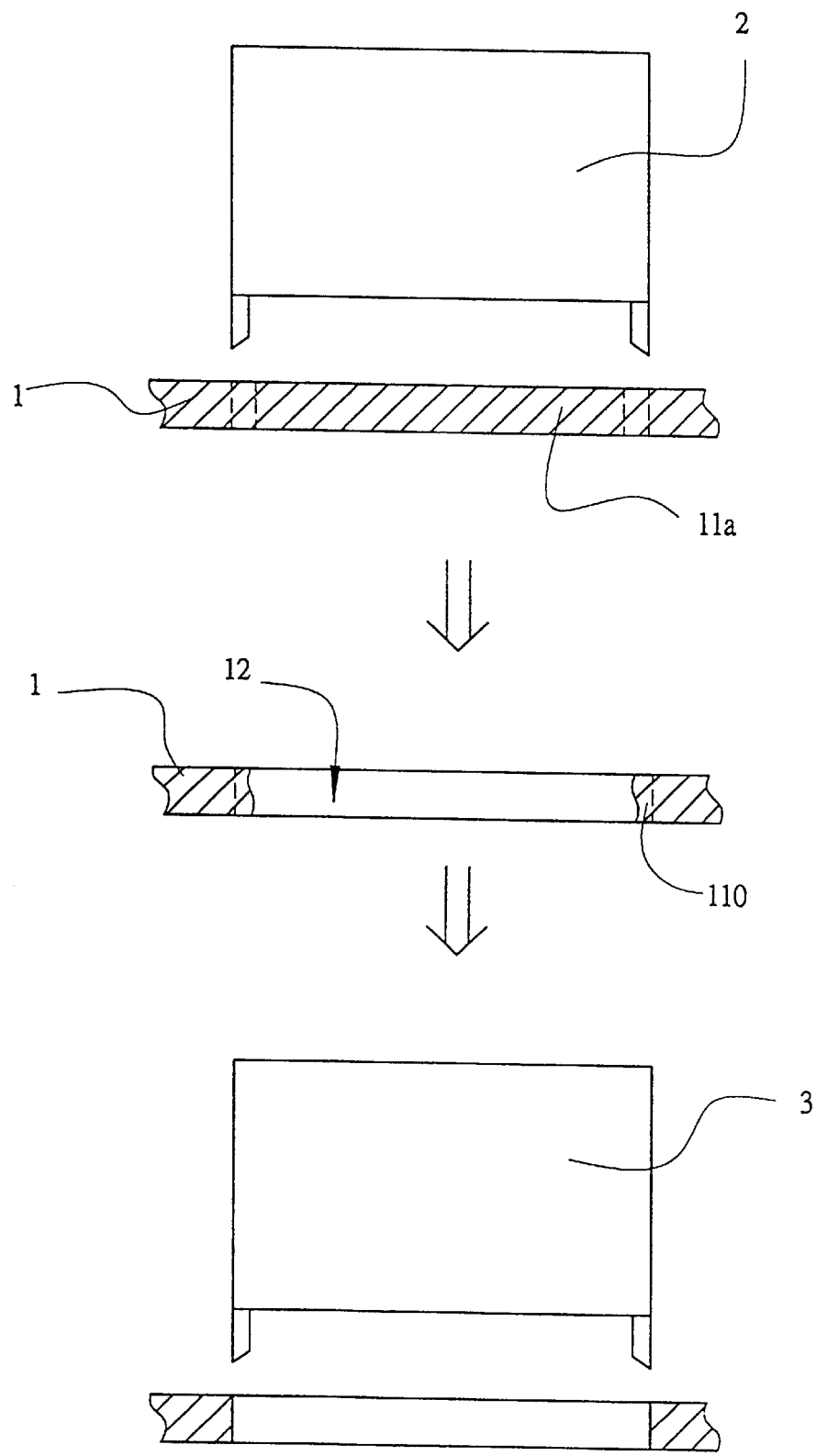
FIG. 2 shows steps of removing a defective circuit board unit from the base plate.
Figure 3:
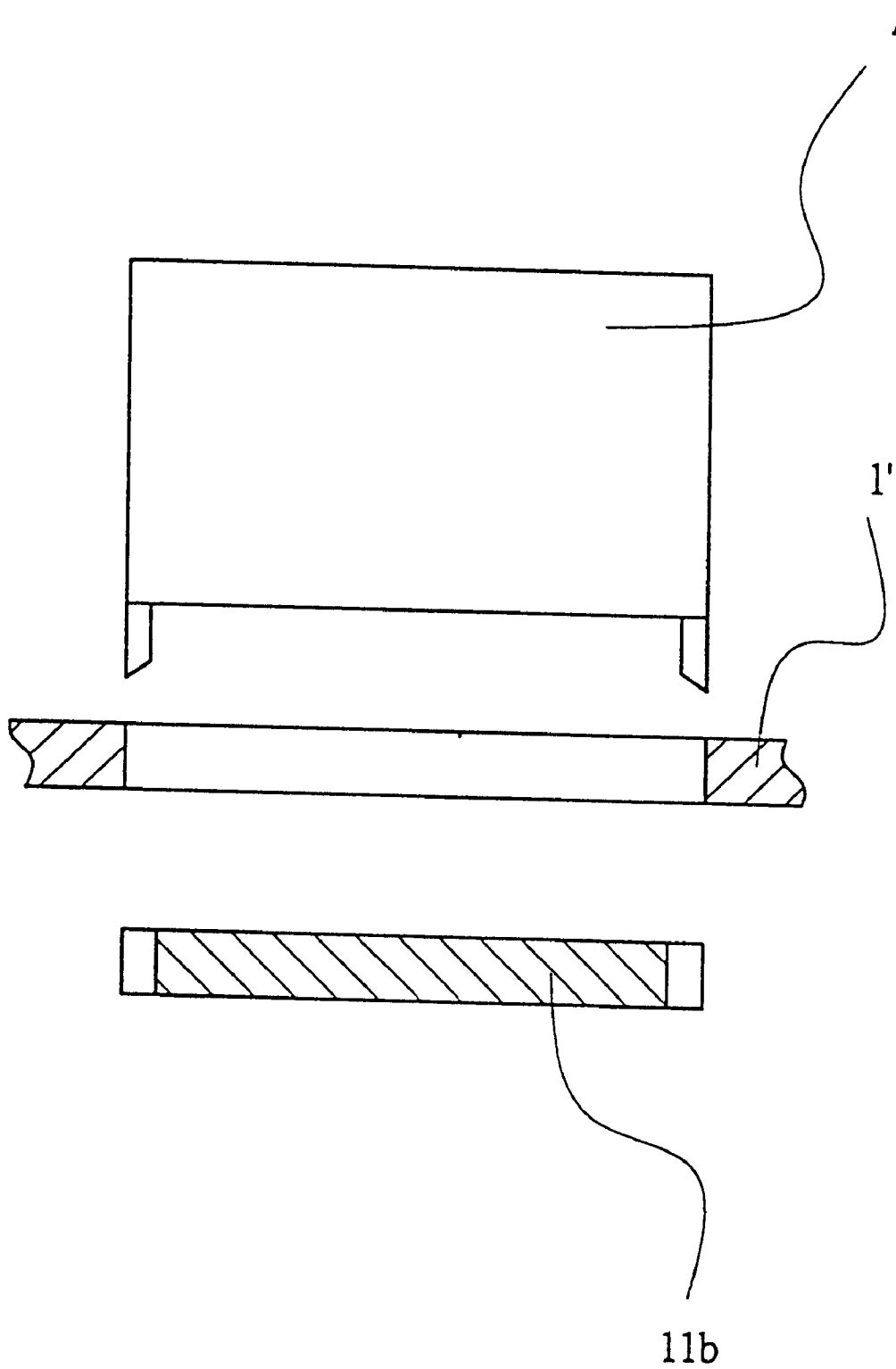
FIG. 3 shows the forming of a substitute circuit board unit.

Please refer to FIG. 1. The present invention relates to a method of manufacturing circuit boards. The method includes the following steps:

(a) Produce a plurality of identical circuit board units 11 on a big base plate 1 at one time, and use a forming punch or a computerized numerical control (CNC) press to form an outer profile for each of the circuit board units 11, so that each circuit board unit 11 is connected to the base plate 1 only at several connecting joints 110 spaced along an outer periphery of the circuit board unit 11;

(b) Conduct a circuit test for each of the circuit board units 11 on the base plate 1;

(c) If any defective circuit board unit 11a is found on the base plate 1 and the latter requires a repair, use a cutting module 2 to cut the connecting joints 110 between the defective circuit board unit 11a and the base plate 1, so as to remove the defective circuit board unit 11a from the base plate 1 and leave a void 12 on the base plate 1, as shown in FIG. 2;

(d) Use a trimming module 3 to trim off any irregular edges at the cut connecting joints 110, as shown in FIG. 2;

(e) Use a shearing module 4 to cut a substitute and good circuit board unit lib from a spare base plate 1', as shown in FIG. 3; and (f) Use a suitable tool to move the substitute circuit board unit 11b into the void 12 on the base plate 1, and fix the substitute circuit board unit 11b in place in the void 12 with suitable means, such as an adhesive, to complete repairing of the base plate 1.

According to the above method, when one or more circuit board units 11 on the base plate 1 are found defective through circuit tests, the defective circuit board units la are cut from the base plate 1 with a cut module 2, and a trimming module 3 is used to trim off the broken connecting joints 110 left on the base plate 1 to form a void 12 having a smoothened edge on the base plate 1. Thereafter, a shearing module 4 is used to cut a good and substitute circuit board unit lib from a spare base plate 1', and the substitute circuit board unit 11b is moved with suitable means into the void 12. Finally, the substitute circuit board unit 11b is fixedly located in the void 12 with adhesive to repair the base plate 1.

With the method of the present invention, the base plate 1 may be repaired to keep other circuit board units 11 that are in good conditions. Only the defective circuit board units 11a are removed and replaced with good circuit board units 11b obtained from a spare base plate 1'. The manufacturing cost for mass-produced circuit boards can therefore be reduced to enhance a competing ability of the produced circuit boards.

What is claimed is:

1. A method of manufacturing circuit boards, comprising the following steps:

(a) Producing a plurality of identical circuit board units on a big base plate at one time, and using a forming punch or a computerized numerical control (CNC) press to form an outer profile for each of said circuit board units, so that each said circuit board unit is connected to said base plate only at several connecting joints spaced along an outer periphery of each said circuit board unit;

(b) Conducting a circuit test for each said circuit board unit formed on said base plate;

(c) any defective circuit board unit being found on said base plate and said base plate requiring repair, using a cutting module to cut said connecting joints between said defective circuit board unit and said base plate, so as to remove said defective circuit board unit from said base plate and leave a void on said base plate;

(d) using trimming module to trim off any irregular edges at said connecting joints that have been cut broken;

(e) using a shearing module to cut a substitute and good circuit board unit from a spare base plate; and (f) using a predetermined tool to move said substitute circuit board unit into said void on said base plate, and fixing said substitute circuit board unit in place in said void with suitable means, such as an adhesive, to complete the repair of said base plate.

* * * * *